(12) United States Patent
Liu

(10) Patent No.: US 11,038,002 B2
(45) Date of Patent: Jun. 15, 2021

(54) DOUBLE-SIDED DISPLAY DEVICE AND METHOD OF MANUFACTURING SAME

(71) Applicant: WUHAN CHINA STAR OPTOELECTRONICS SEMICONDUCTOR DISPLAY TECHNOLOGY CO., LTD., Hubei (CN)

(72) Inventor: Jie Liu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 78 days.

(21) Appl. No.: 16/462,230

(22) PCT Filed: Jan. 15, 2019

(86) PCT No.: PCT/CN2019/071795
§ 371 (c)(1),
(2) Date: May 19, 2019

(87) PCT Pub. No.: WO2020/077903
PCT Pub. Date: Apr. 23, 2020

(65) Prior Publication Data
US 2020/0273932 A1    Aug. 27, 2020

(30) Foreign Application Priority Data

Oct. 17, 2018    (CN) .......................... 201811208658.6

(51) Int. Cl.
| H01L 27/32 | (2006.01) |
| H01L 51/52 | (2006.01) |
| H01L 51/56 | (2006.01) |

(52) U.S. Cl.
CPC ...... *H01L 27/3267* (2013.01); *H01L 27/3246* (2013.01); *H01L 27/3258* (2013.01);
(Continued)

(58) Field of Classification Search
CPC ............. H01L 27/3267; H01L 27/3246; H01L 27/3258; H01L 51/5206; H01L 51/5218;
(Continued)

(56) References Cited

U.S. PATENT DOCUMENTS

2007/0290213 A1* 12/2007 Kobayashi .......... H01L 51/5265
257/79
2010/0200869 A1* 8/2010 Sekiya ................ H01L 27/3246
257/88
(Continued)

*Primary Examiner* — Kyoung Lee
*Assistant Examiner* — Christina A Sylvia
(74) *Attorney, Agent, or Firm* — Soroker Agmon Nordman

(57) ABSTRACT

A double-sided display device and a method of manufacturing the same are provided. The double-sided display device includes a substrate, an active layer, an electrical insulating layer, a pixel defining layer, and a first display region and a second display region. The first display region includes a first transparent anode, a first electroluminescence film, and a first reflective cathode. The second display region includes a reflective anode, a second transparent anode, a second electroluminescence film, and a transparent cathode. The method includes steps of: S1: manufacturing an active layer, S2: manufacturing an electrical insulating layer, S3: manufacturing source/drain electrodes, S4: manufacturing a reflective anode, S5: manufacturing a transparent anode, S6: manufacturing a pixel defining layer, S7: manufacturing an electroluminescence film, S8: manufacturing a reflective cathode, and S9: manufacturing a transparent cathode.

13 Claims, 11 Drawing Sheets

(52) U.S. Cl.
CPC ...... *H01L 51/5206* (2013.01); *H01L 51/5218* (2013.01); *H01L 51/5221* (2013.01); *H01L 51/5234* (2013.01); *H01L 51/56* (2013.01); *H01L 2227/323* (2013.01)

(58) Field of Classification Search
CPC . H01L 51/5221; H01L 51/5234; H01L 51/56; H01L 2227/323
See application file for complete search history.

(56) References Cited

U.S. PATENT DOCUMENTS

2016/0380035 A1* 12/2016 Cho .................... H01L 27/3246
                                                                 257/40
2017/0148860 A1*  5/2017 Park ........................ H01L 51/52
2020/0313108 A1* 10/2020 Jang ...................... H01L 51/502

* cited by examiner

DOUBLE-SIDED DISPLAY DEVICE AND METHOD OF MANUFACTURING SAME

BACKGROUND OF INVENTION

Field of Invention

The present invention relates to a display technology, and more particularly to a double-sided display device and a method of manufacturing the same.

DESCRIPTION OF PRIOR ART

Organic light-emitting diodes (OLEDs) are also known as organic electroluminescence displays or organic light-emitting semiconductors. At present, an electroluminescence (EL) material in an OLED display is formed by evaporation or printing. An EL material in an OLED is composed of a plurality of materials in a certain order. The work function of the electrodes on both sides of the EL material must meet requirements of the EL material in order to have a high luminous efficiency, which results in a small variety of electrodes for the EL material.

FIG. 1 is a schematic diagram of a pixel structure of a double-sided display, wherein the first display region 4 and the second display region 5 are two independent units with different illumination directions. The first display region 4 corresponds to the left side in FIG. 2, and the second display region 5 corresponds to the right side in FIG. 2. The outer border is the pixel defining layer 6. The rectangles represent RGB three sub-pixels. Other sub-pixel designs can also be used. FIG. 2 is a cross-sectional view of a prior art double-sided display device. The left side is the first display region 4, which is a bottom emission structure. The light emitting direction is downward. The right side is the second display region 5, which is a top emitting structure. The direction of illumination is upward. The upper surface of the substrate 1 is provided with an active layer 2. The active layer contains at least one TFT device. The upper surface of the active layer 2 is provided with an electrical insulating layer 3. The electrical insulating layer 3 is provided with a pixel defining layer 6. The first display region 4 includes a first transparent anode 41 attached to the upper surface of the pixel defining layer 6. The first electroluminescence film 42 is attached to the first transparent anode 41. The first reflective cathode 43 is attached to the upper surface of the first electroluminescence film 42 and the inner side wall of the first through hole 61. The second display region 5 includes a reflective anode 51 attached to the upper surface of the pixel defining layer 6, a second electroluminescence film 53 attached to the upper surface of the reflective anode 51, and a transparent cathode 54 attached to the upper surface the second electroluminescence film 53 and the inner side wall of the second through hole 62.

However, when adopting this structure, due to work function requirements of the EL material, it is required that the order of the EL materials to be completely opposite to meet luminous efficiency requirements. For example, when the order of the EL material on the left side is ABCDE, the order of the EL material on the right side must be EDCBA to ensure reliable luminous efficiency. This requires the use of two complete processes of the Fine Mask evaporation process, which greatly increases process complexity.

On the other hand, the top emission structure on the right side also has a difficult problem to solve. Due to work function requirements, the transparent cathode can only use a metal with a work function such as a magnesium-silver alloy, and ITO is not suitable here. When magnesium-silver alloy is used as a transparent electrode, its thickness is affected by two contradictory factors of resistance and transparency. If the thickness is too large, the transmittance is too low. If the thickness is small, the transmittance is high, but the resistance is too large. Under normal circumstances, the R&D personnel will give priority to the design that meets the transmittance, and solve the voltage drop caused by excessive resistance by providing an auxiliary cathode.

The technical problem in the prior art is that two complete processes of Fine Mask evaporation process resulting in a complicated process. And the transparent cathode in the top emission structure can only use, for example, a magnesium-silver alloy or the like. The magnesium-silver alloy as a transparent electrode has too large resistance, when acquiring the high transmittance of the magnesium-silver alloy to result in a small thickness.

SUMMARY OF INVENTION

In view of the above, the present invention provides a double-sided display device and a method of manufacturing the same.

In order to achieve above-mentioned object of the present invention, one embodiment of the disclosure provides a double-sided display device including a substrate, an active layer, an electrical insulating layer, a pixel defining layer, and a first display region and a second display region. The active layer is disposed on a side surface of the substrate. The electrical insulating layer is disposed on a side surface of the active layer opposite to another side surface of the active layer facing the substrate. The pixel defining layer is disposed on a side surface of the electrical insulating layer opposite to another side surface of the electrical insulating layer facing the active layer. The pixel defining layer includes at least one first through hole and at least one second through hole. The first display region and the second display region set up on the side surface of the electrical insulating layer opposite to another side surface of the electrical insulating layer facing the substrate.

The first display region includes a first transparent anode, a first electroluminescence film, and a first reflective cathode. The first transparent anode is attached to the side surface of the electrical insulating layer opposite to another side surface of the electrical insulating layer facing the active layer. The first transparent anode is disposed corresponding to the at least one first through hole. The first electroluminescence film is disposed in the at least one first through hole, and attached to a side surface of the first transparent anode opposite to another side surface of the first transparent anode facing the electrical insulating layer. The first reflective cathode is disposed in the at least one first through hole, attached to a side surface of the first electroluminescence film opposite to another side surface of the first electroluminescence film facing the first transparent anode, and also attached to an inner sidewall of the at least one first through hole.

The second display region includes a reflective anode, a second transparent anode, a second electroluminescence film, and a transparent cathode. The reflective anode is attached to the side surface of the electrical insulating layer opposite to another side surface of the electrical insulating layer facing the active layer, separated from the first transparent anode, and disposed corresponding to the at least one second through hole. The second transparent anode is covering a side surface of the reflective anode opposite to another side surface of the reflective anode facing the active layer, and covering an outer sidewall of the reflective anode. The second electroluminescence film is disposed in the at least one second through hole, and attached to a side surface of the second transparent anode opposite to another side surface of the second transparent anode facing the reflective anode. The transparent cathode is disposed in the at least one second through hole, attached to a side surface of the second electroluminescence film opposite to another side surface of the second electroluminescence film facing the second transparent anode, and also attached to an inner sidewall of the at least one second through hole.

In one embodiment of the disclosure, the transparent cathode includes a transparent extending part attached to a side surface of the pixel defining layer opposite to another side surface of the pixel defining layer facing the substrate, extending to the inner sidewall of the at least one second through hole, and surrounding the at least one second through hole. The double-sided display device further includes a second reflective cathode attached to a side surface of the transparent extending part opposite to another side surface of the transparent extending part facing the substrate.

In one embodiment of the disclosure, the double-sided display device further includes a second reflective cathode attached to a side surface of the pixel defining layer opposite to another side surface of the pixel defining layer facing the substrate and surrounding the at least one second through hole. The transparent cathode includes a transparent extending part attached to a side surface of the second reflective cathode opposite to another side surface of the second reflective cathode facing the substrate and extending to the inner sidewall of the at least one second through hole.

In one embodiment of the disclosure, the transparent cathode covers the first reflective cathode, the second electroluminescence film, and a side surface of the pixel defining layer opposite to another side surface of the pixel defining layer facing the substrate.

In one embodiment of the disclosure, the double-sided display device further includes a first thin film transistor device and a second thin film transistor device. The first transparent anode connects to a drain electrode of the first thin film transistor device, and the reflective anode connects to a drain electrode of the second thin film transistor device.

Furthermore, another embodiment of the disclosure provides a method of manufacturing a double-sided display device. The method includes the steps of:

Step S1: manufacturing an active layer includes the step of providing the active layer on a substrate. Step S2: manufacturing an electrical insulating layer includes the steps of providing the electrical insulating layer on the active layer. Step S3: manufacturing source/drain electrodes includes the steps of etching and forming an electrical conductor on a portion of an upper surface of the active layer to form patterned source/drain electrodes. Step S4: manufacturing a reflective anode includes the step of providing the reflective anode attached to an upper surface of the electrical insulating layer at a second display region. Step S5: manufacturing a transparent anode includes the steps of providing a first transparent anode attached to the upper surface of the electrical insulating layer at a first display region, and providing a second transparent anode covering an upper surface and an outer sidewall of the reflective anode at the second display region. Step S6: manufacturing a pixel defining layer includes the steps of providing the pixel defining layer on upper surfaces of the electrical insulating layer, the reflective anode, the first transparent anode and the second transparent anode, and forming at least one first through hole and at least one second through hole at the pixel defining layer, wherein the at least one first through hole is corresponding to the first transparent anode, and the at least one second through hole is corresponding to the reflective anode. Step S7: manufacturing an electroluminescence film includes the steps of providing a first electroluminescence film attached the upper surface of the first transparent anode in the at least one first through hole, and providing a second electroluminescence film attached an upper surface of the second transparent anode in the at least one second through hole. Step S8: manufacturing a reflective cathode includes the step of providing a first reflective cathode in the at least one first through hole, and the first reflective cathode attached to an upper surface of the first electroluminescence film and also attached to an inner sidewall of the at least one first through hole. Step S9: manufacturing a transparent cathode includes the step of providing the transparent cathode in the at least one second through hole, and the transparent cathode attached to an upper surface of the second electroluminescence film and also attached to an inner side wall of the at least one second through hole.

In one embodiment of the disclosure, the step of manufacturing a reflective cathode further includes the step of providing a second reflective cathode attached to an upper surface of the pixel defining layer and surrounding the at least one second through hole. The transparent cathode in the step of manufacturing a transparent cathode further includes a transparent extending part attached to an upper surface of the second reflective cathode and extending to the inner sidewall of the at least one second through hole.

In one embodiment of the disclosure, the transparent cathode in the step of manufacturing a transparent cathode, covers upper surfaces of the first reflective cathode, the second electroluminescence film and the pixel defining layer.

In one embodiment of the disclosure, the method of manufacturing a double-sided display device performs the step of manufacturing a transparent cathode after the step of manufacturing an electroluminescence film before the step of manufacturing a reflective cathode.

In one embodiment of the disclosure, the transparent cathode in the step of manufacturing a transparent cathode further includes a transparent extending part attached to an upper surface of the pixel defining layer, extending to the inner sidewall of the at least one second through hole, and surrounding the at least one second through hole. The step of manufacturing a reflective cathode provides a second reflective cathode attached to an upper surface of the transparent extending part.

In comparison with the prior art, the double-sided display device and a method manufacturing the same solve the technical problems that different arranged orders of the two groups of electrodes for electroluminescence film in the prior art, and ensure reliable luminous efficiency. The overlapping of the transparent cathode and the reflective cathode, and taking the reflective cathode as an auxiliary electrode of the transparent cathode solve the technical problem of excessive cathode resistance in the top emission structure. At the same time, the process of the evaporation process is simplified, and the production efficiency is improved.

DETAILED DESCRIPTION OF PREFERRED EMBODIMENTS

The following description of the embodiments is provided by reference to the following drawings and illustrates the specific embodiments of the present invention. Directional terms mentioned in the present invention, such as "up," "down," "top." "bottom," "forward," "backward," "left," "right," "inside," "outside," "side," "peripheral," "central," "horizontal," "peripheral," "vertical," "longitudinal," "axial," "radial," "uppermost" or "lowermost," etc., are merely indicated the direction of the drawings. Therefore, the directional terms are used for illustrating and understanding of the application rather than limiting thereof.

First Embodiment

Figure 1:
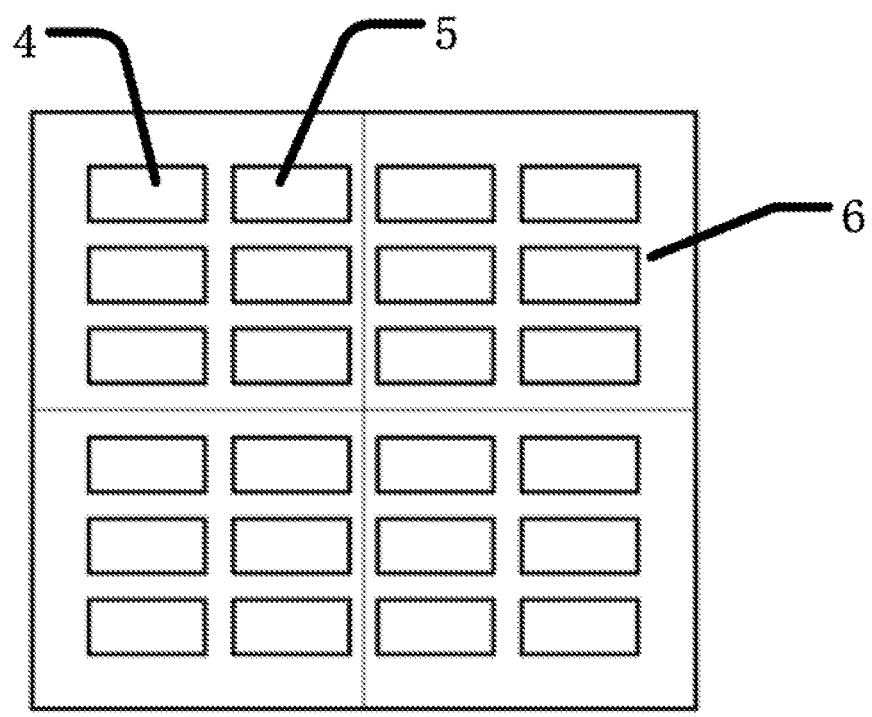
FIG. 1 is a schematic layer view of pixels structure of a double-sided display device of prior art.
Figure 2:
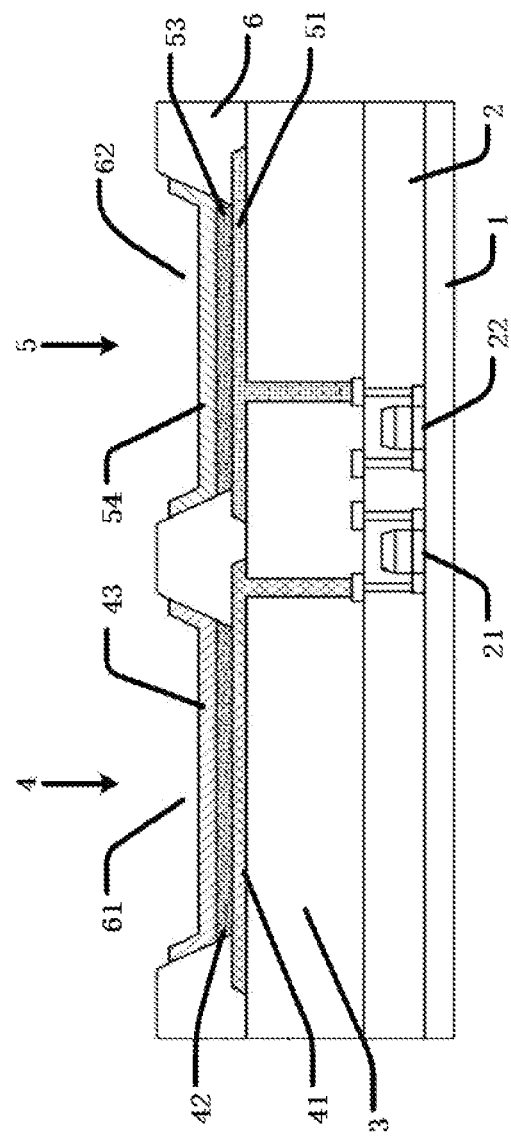
FIG. 2 is a schematic cross section view of a double-sided display device of prior art.
Figure 3:
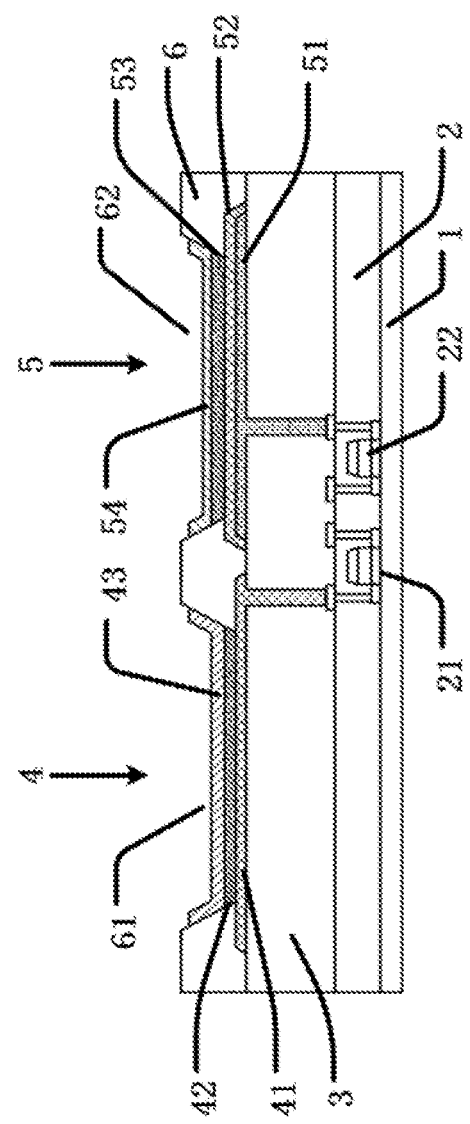
FIG. 3 is a schematic cross section view of a double-sided display device according to the first embodiment of the disclosure.

Referring to FIG. 3, one embodiment of the present invention provides a double-sided display device including a substrate 1, an active layer 2, an electrical insulating layer 3, a pixel defining layer 6, and a first display region 4 and a second display region 5. The active layer 2 is disposed on an upper side surface of the substrate 1. The electrical insulating layer 3 is disposed on an upper side surface of the active layer 2. The pixel defining layer 6 is disposed on an upper side surface of the electrical insulating layer 3. The first display region 4 and the second display region 5 set up side by side on the upper side surface of the electrical insulating layer 3. The double-sided display device further includes at least one thin film transistor device in the active layer 2. The pixel defining layer 6 includes at least one first through hole 61 and at least one second through hole 62.

The first display region 4 includes a first transparent anode 41, a first electroluminescence film 42, and a first reflective cathode 43. The first transparent anode 41 is attached to the upper side surface of the electrical insulating layer 3. The first transparent anode 41 is disposed corresponding to the at least one first through hole 61. The first transparent anode 41 connects to a first thin film transistor device 21 passing through the electrical insulating layer 3. The first electroluminescence film 42 is disposed in the at least one first through hole 61, and attached to an upper side surface of the first transparent anode 41. The first reflective cathode 43 is disposed in the at least one first through hole 61, attached to an upper side surface of the first electroluminescence film 42, and also attached to an inner sidewall of the at least one first through hole 61.

The second display region 5 includes a reflective anode 51, a second transparent anode 52, a second electroluminescence film 53, and a transparent cathode 54. The reflective anode 51 is attached to the upper side surface of the electrical insulating layer 3, separated from the first transparent anode 41, and disposed corresponding to the at least one second through hole 62. The reflective anode 51 connects to a second thin film transistor device 22 passing through the electrical insulating layer 3. The second transparent anode 52 is covering the reflective anode 51, and covering an outer sidewall of the reflective anode 51. The second electroluminescence film 53 is disposed in the at least one second through hole 62, and attached to an upper side surface of the second transparent anode 52. The transparent cathode 54 is disposed in the at least one second through hole 62, attached to an upper side surface of the second electroluminescence film 53, and also attached to an inner sidewall of the at least one second through hole 62.

The first transparent anode 41 and the second transparent anode 52 have a thickness from 20 nm to 100 nm, and are made of a material having high transmittance, high electrical conductivity, and high work function, including: indium tin oxide, indium zinc oxide, and aluminum-doped zinc oxide. Or indium zinc tin oxide. The reflective anode 51 is made of a material a material having high reflectivity, high electrical conductivity and high work function, including silver, gold or platinum. The transparent cathode 54 is made of a material having high transmittance, high electrical conductivity and low work function, including lanthanum hexaboride or magnesium aluminum alloy. The first reflective cathode 43 is made of a material having high reflectivity, high electrical conductivity, and low work function, including aluminum or magnesium.

In this embodiment, the design that the transparent anode covers the reflective anode solves the technical problem of different order requirements for the electroluminescence films of the two groups of electrodes in the prior art. The design simplifies the original evaporation deposition process with two fine masks to a new process with only one open mask. It simplifies the process and improves process efficiency.

Figure 4:
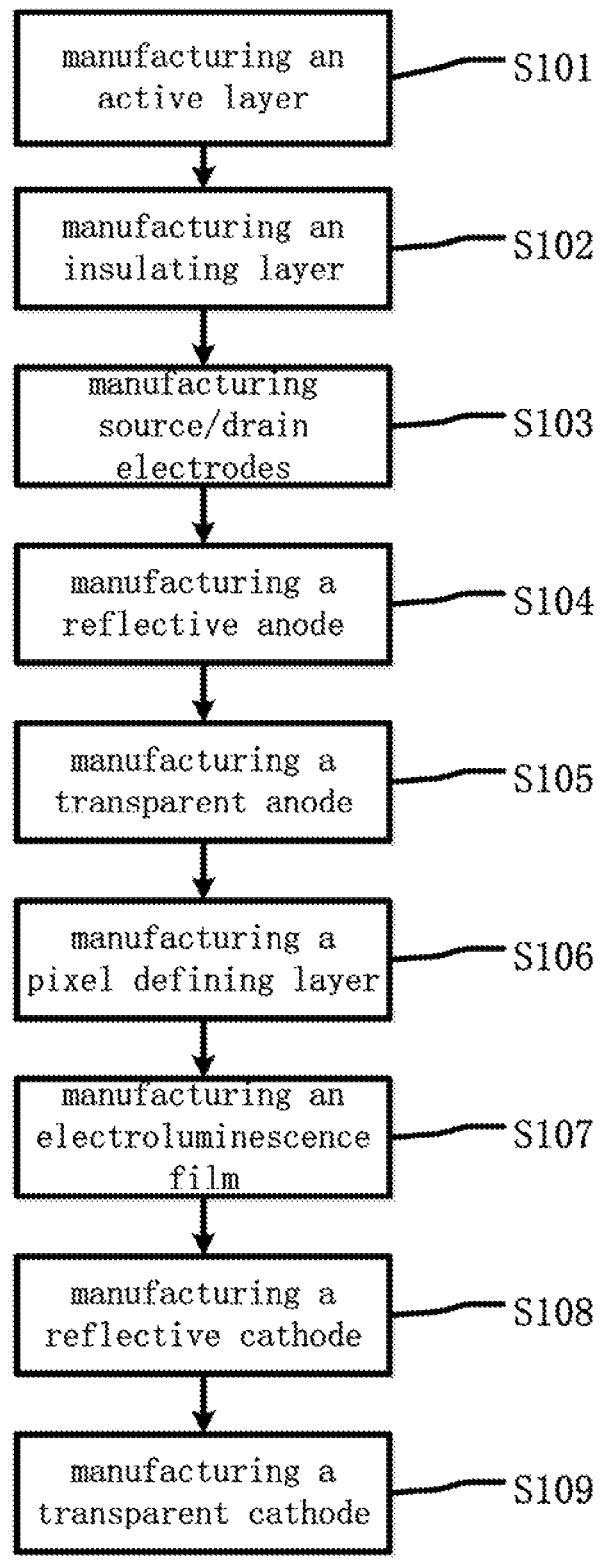
FIG. 4 is a schematic flowchart of a method of manufacturing a double-sided display device according to the first embodiment of the disclosure.

Referring to FIG. 4, another embodiment of the disclosure provides a method of manufacturing a double-sided display device. The method includes the steps from S101 to S109.

At Step Block S101: manufacturing an active layer includes the step of providing the active layer 2 on a substrate 1 and providing at least one thin film transistor device in the active layer 2. At Step Block S102: manufacturing an electrical insulating layer includes the steps of providing the electrical insulating layer 3 on the active layer 2. At Step Block S103: manufacturing source/drain electrodes includes the steps of etching and forming an electrical conductor on a portion of an upper surface of the active layer 2 to form patterned source/drain electrodes. At Step Block S104: manufacturing a reflective anode includes the step of providing the reflective anode 51 attached to an upper surface of the electrical insulating layer 3 at a second display region 5 and connected to a drain electrode of a second thin film transistor device 22. At Step Block S105: manufacturing a transparent anode includes the steps of providing a first transparent anode 41 attached to the upper surface of the electrical insulating layer 3 at a first display region 4 and connected to a drain electrode of a first thin film transistor device 21, and providing a second transparent anode 52 covering an upper surface and an outer sidewall of the reflective anode 51 at the second display region 5. At Step Block S106: manufacturing a pixel defining layer includes the steps of providing the pixel defining layer 6 on upper surfaces of the electrical insulating layer 3, the reflective anode 51, the first transparent anode 41 and the second transparent anode 52, and forming at least one first through hole 61 and at least one second through hole 62 at the pixel defining layer 6, wherein the at least one first through hole 61 is corresponding to the first transparent anode 41, and the at least one second through hole 62 is corresponding to the reflective anode 51. At Step Block S107: manufacturing an electroluminescence film includes the steps of providing a first electroluminescence film 42 attached the upper surface of the first transparent anode 41 in the at least one first through hole 61, and providing a second electroluminescence film 53 attached an upper surface of the second transparent anode 52 in the at least one second through hole 62. At Step Block S108: manufacturing a reflective cathode includes the step of providing a first reflective cathode 43 in the at least one first through hole 61, and the first reflective cathode 43 attached to an upper surface of the first electroluminescence film 42 and also attached to an inner sidewall of the at least one first through hole 61. At Step Block S109: manufacturing a transparent cathode includes the step of providing the transparent cathode 54 in the at least one second through hole 62, and the transparent cathode 54 attached to an upper surface of the second electroluminescence film 53 and also attached to an inner side wall of the at least one second through hole 62.

Figure 5:
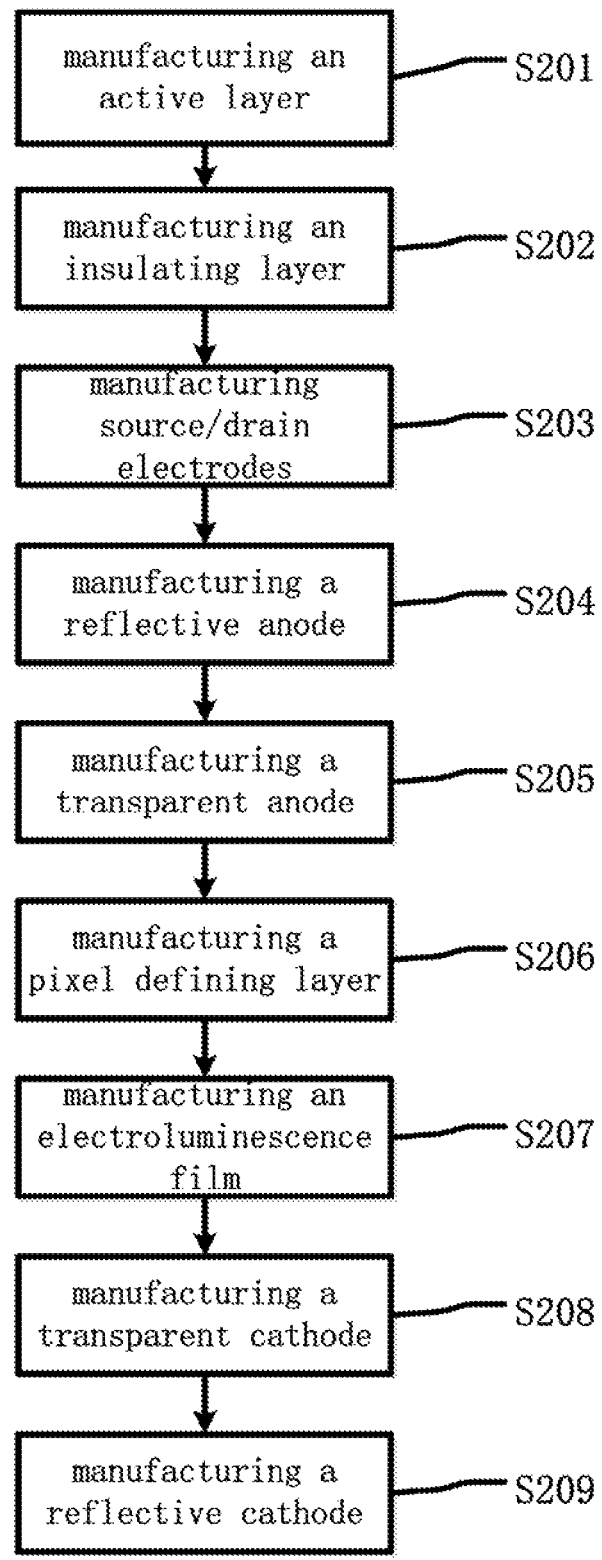
FIG. 5 is a schematic flowchart of another method of manufacturing a double-sided display device according to the first embodiment of the disclosure.

Referring to FIG. 5, another embodiment of the disclosure provides another method of manufacturing a double-sided display device. The method includes the steps from S201 to S209.

At Step Block S201: manufacturing an active layer includes the step of providing the active layer 2 on a substrate 1 and providing at least one thin film transistor device in the active layer 2. At Step Block S202: manufacturing an electrical insulating layer includes the steps of providing the electrical insulating layer 3 on the active layer 2. At Step Block S203: manufacturing source/drain electrodes includes the steps of etching and forming an electrical conductor on a portion of an upper surface of the active layer 2 to form patterned source/drain electrodes. At Step Block S204: manufacturing a reflective anode includes the step of providing the reflective anode 51 attached to an upper surface of the insulating layer 3 at a second display region 5 and connected to a drain electrode of a second thin film transistor device 22. At Step Block S205: manufacturing a transparent anode includes the steps of providing a first transparent anode 41 attached to the upper surface of the electrical insulating layer 3 at a first display region 4 and connected to a drain electrode of a first thin film transistor device 21, and providing a second transparent anode 52 covering an upper surface and an outer sidewall of the reflective anode 51 at the second display region 5. At Step Block S206: manufacturing a pixel defining layer includes the steps of providing the pixel defining layer 6 on upper surfaces of the electrical insulating layer 3, the reflective anode 51, the first transparent anode 41 and the second transparent anode 52, and forming at least one first through hole 61 and at least one second through hole 62 at the pixel defining layer 6, wherein the at least one first through hole 61 is corresponding to the first transparent anode 41, and the at least one second through hole 62 is corresponding to the reflective anode 51. At Step Block S207: manufacturing an electroluminescence film includes the steps of providing a first electroluminescence film 42 attached the upper surface of the first transparent anode 41 in the at least one first through hole 61, and providing a second electroluminescence film 53 attached an upper surface of the second transparent anode 52 in the at least one second through hole 62. At Step Block S208: manufacturing a transparent cathode includes the step of providing the transparent cathode 54 in the at least one second through hole 62, and the transparent cathode 54 attached to an upper surface of the second electroluminescence film 53 and also attached to an inner side wall of the at least one second through hole 62. At Step Block S209: manufacturing a reflective cathode includes the step of providing a first reflective cathode 43 in the at least one first through hole 61, and the first reflective cathode 43 attached to an upper surface of the first electroluminescence film 42 and also attached to an inner sidewall of the at least one first through hole 61.

In this embodiment, the design that the transparent anode covers the reflective anode solves the technical problem of different order requirements for the electroluminescence films of the two groups of electrodes in the prior art. The design simplifies the original evaporation deposition process with two fine masks to a new process with only one open mask. It simplifies the process and improves process efficiency.

Second Embodiment

Figure 6:
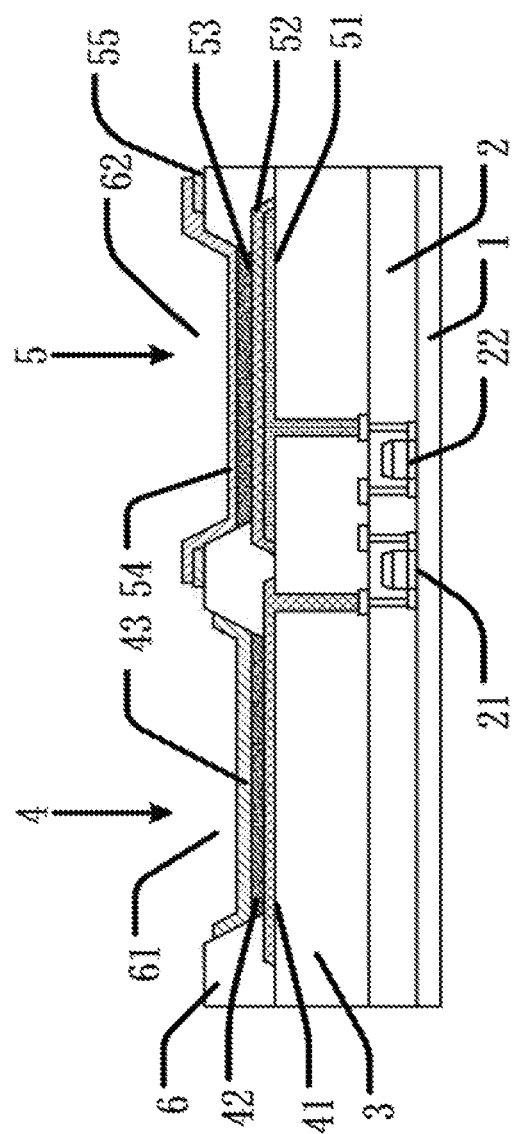
FIG. 6 is a schematic cross section view of a double-sided display device according to the second embodiment of the disclosure.

Referring to FIG. 6, one embodiment of the disclosure provides a double-sided display device similar to the first embodiment. The difference is that the double-sided display device disclosed here further includes a second reflective cathode 55 attached to an upper side surface of the pixel defining layer 6 and surrounding the at least one second through hole 62. The transparent cathode 54 includes a transparent extending part attached to an upper side surface of the second reflective cathode 55 and extending to the inner sidewall of the at least one second through hole 62.

In this embodiment, the design that the transparent anode covers the reflective anode solves the technical problem of different order requirements for the electroluminescence films of the two groups of electrodes in the prior art. The design simplifies the original evaporation deposition process with two fine masks to a new process with only one open mask. It simplifies the process and improves process efficiency. In this embodiment, the transparent cathode is attached to the second reflective cathode. The second reflective cathode 55 is used as the auxiliary electrode of the transparent cathode 54. Under the premise that the thickness is kept small, the cathode resistance can be effectively reduced. The technical problem of excessive cathode resistance of the top emission structure is solved. It balances two factors of resistance and transparency, expands the selection range of materials for the transparent cathode, and helps to reduce production costs.

Figure 7:
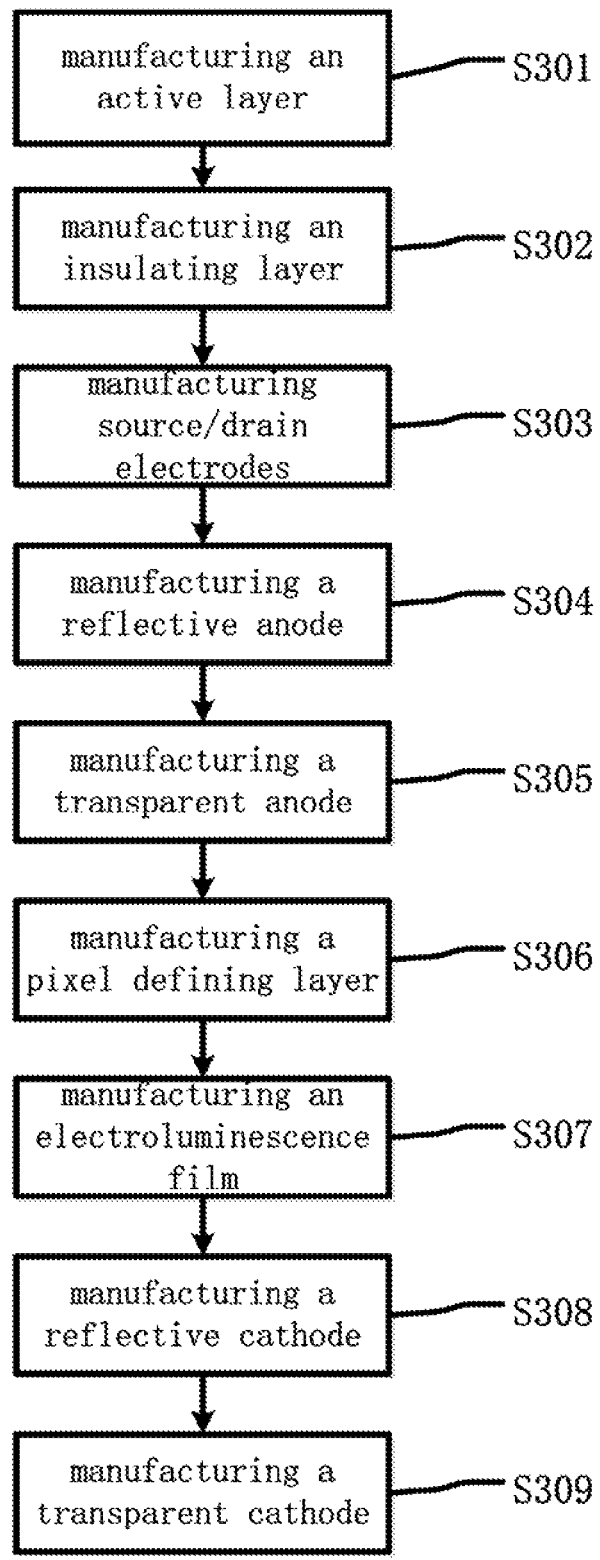
FIG. 7 is a schematic flowchart of a method of manufacturing a double-sided display device according to the second embodiment of the disclosure.

Referring to FIG. 7, an embodiment of the disclosure provides other method of manufacturing a double-sided display device. The method includes the steps from S301 to S309

At Step Block S301: manufacturing an active layer includes the step of providing the active layer 2 on a substrate 1 and providing at least one thin film transistor device in the active layer 2. At Step Block S302: manufacturing an electrical insulating layer includes the steps of providing the electrical insulating layer 3 on the active layer 2. At Step Block S303: manufacturing source/drain electrodes includes the steps of etching and forming an electrical conductor on a portion of an upper surface of the active layer 2 to form patterned source/drain electrodes. At Step Block S304: manufacturing a reflective anode includes the step of providing the reflective anode 51 attached to an upper surface of the electrical insulating layer 3 at a second display region 5 and connected to a drain electrode of a second thin film transistor device 22. At Step Block S305: manufacturing a transparent anode includes the steps of providing a first transparent anode 41 attached to the upper surface of the electrical insulating layer 3 at a first display region 4 and connected to a drain electrode of a first thin film transistor device 21, and providing a second transparent anode 52 covering an upper surface and an outer sidewall of the reflective anode 51 at the second display region 5. At Step Block S306: manufacturing a pixel defining layer includes the steps of providing the pixel defining layer 6 on upper surfaces of the electrical insulating layer 3, the reflective anode 51, the first transparent anode 41 and the second transparent anode 52, and forming at least one first through hole 61 and at least one second through hole 62 at the pixel defining layer 6, wherein the at least one first through hole 61 is corresponding to the first transparent anode 41, and the at least one second through hole 62 is corresponding to the reflective anode 51. At Step Block S307: manufacturing an electroluminescence film includes the steps of providing a first electroluminescence film 42 attached the upper surface of the first transparent anode 41 in the at least one first through hole 61, and providing a second electroluminescence film 53 attached an upper surface of the second transparent anode 52 in the at least one second through hole 62. At Step Block S308: manufacturing a reflective cathode includes the step of providing a first reflective cathode 43 in the at least one first through hole 61, and providing a second reflective cathode 55. The first reflective cathode 43 is attached to an upper surface of the first electroluminescence film 42 and also attached to an inner sidewall of the at least one first through hole 61. The second reflective cathode 55 is attached an upper surface of the pixel defining layer 6 and surrounding the at least one second through hole 62. At Step Block S309: manufacturing a transparent cathode includes the step of providing the transparent cathode 54 in the at least one second through hole 62, and the transparent cathode 54 attached to an upper surface of the second electroluminescence film 53 and also attached to an inner side wall of the at least one second through hole 62. The transparent cathode 54 includes a transparent extending part attached to an upper side surface of a second reflective cathode 55, and extending to the inner sidewall of the at least one second through hole 62.

In this embodiment, the design that the transparent anode covers the reflective anode solves the technical problem of different order requirements for the electroluminescence films of the two groups of electrodes in the prior art. The design simplifies the original evaporation deposition process with two fine masks to a new process with only one open mask. It simplifies the process and improves process efficiency. In this embodiment, the transparent cathode is attached to the second reflective cathode. The second reflective cathode 55 is used as the auxiliary electrode of the transparent cathode 54. Under the premise that the thickness is kept small, the cathode resistance can be effectively reduced. The technical problem of excessive cathode resistance of the top emission structure is solved. It balances two factors of resistance and transparency, expands the selection range of materials for the transparent cathode, and helps to reduce production costs.

Third Embodiment

Figure 8:
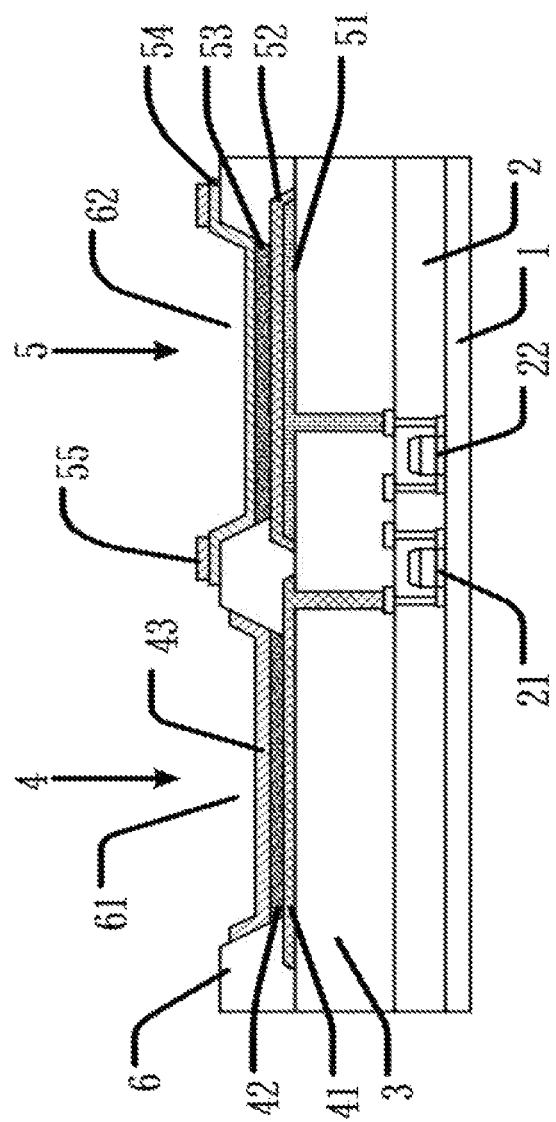
FIG. 8 is a schematic cross section view of a double-sided display device according to the third embodiment of the disclosure.
Figure 9:
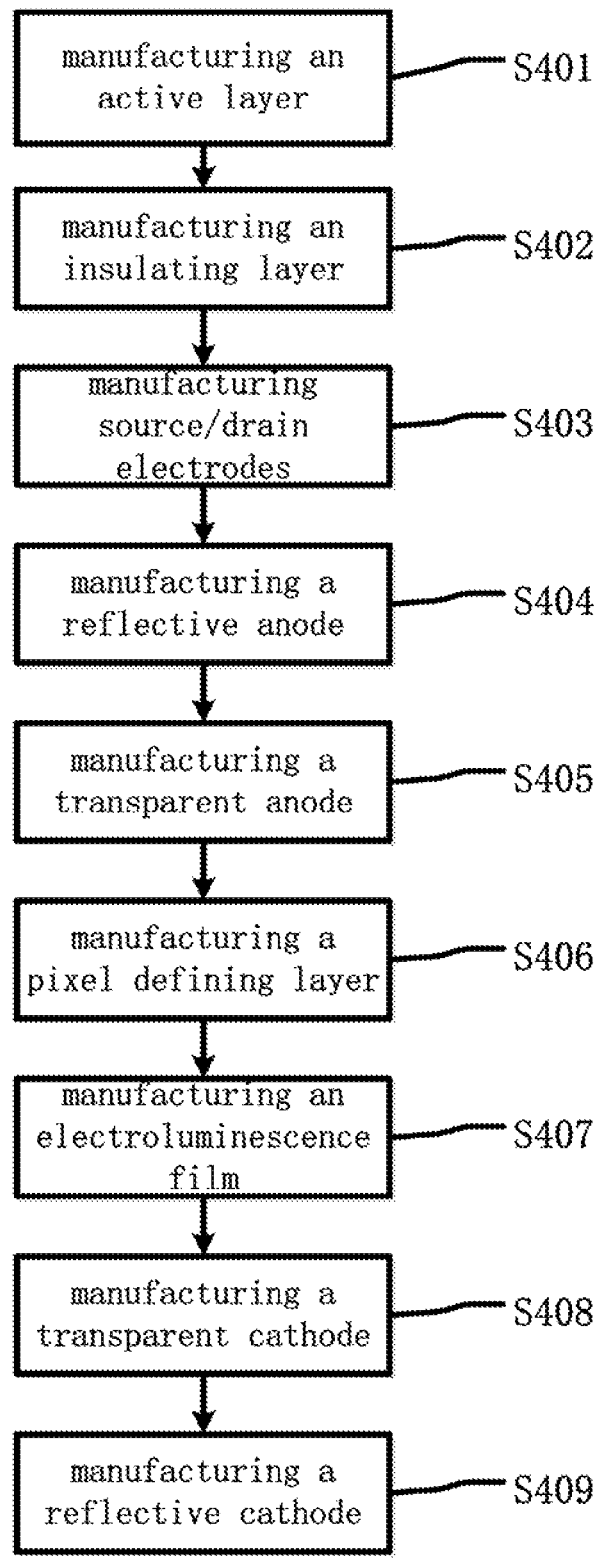
FIG. 9 is a schematic flowchart of a method of manufacturing a double-sided display device according to the third embodiment of the disclosure.

Referring to FIG. 8, one embodiment of the disclosure provides a double-sided display device similar to the first embodiment. The difference is that the double-sided display device disclosed here includes a transparent cathode laps a reflective cathode. The transparent cathode 54 in the second display region 5 includes a transparent extending part attached to an upper side surface of the pixel defining layer 6, and extending to the inner sidewall of the at least one second through hole 62, and surrounding the at least one second through hole 62. The second reflective cathode 55 is attached to an upper side surface of the transparent extending part. The second reflective cathode 55 is used as the auxiliary electrode of the transparent cathode 54. Under the premise that the thickness is kept small, the cathode resistance can be effectively reduced. The technical problem of excessive cathode resistance of the top emission structure is solved. It balances two factors of resistance and transparency, expands the selection range of materials for the transparent cathode, and helps to reduce production cost Referring to FIG. 9, another embodiment of the disclosure provides another method of manufacturing a double-sided display device. The method includes the steps from S401 to S409.

At Step Block S401: manufacturing an active layer includes the step of providing the active layer 2 on a substrate 1 and providing at least one thin film transistor device in the active layer 2. At Step Block S402: manufacturing an electrical insulating layer includes the steps of providing the electrical insulating layer 3 on the active layer 2, and photolithographing the electrical insulating layer 3 to form a patterned gate electrode. At Step Block S403: manufacturing source/drain electrodes includes the steps of etching and forming an electrical conductor on a portion of an upper surface of the active layer 2 exposed by the electrical insulating layer 3 to form patterned source/drain electrodes. At Step Block S404: manufacturing a reflective anode includes the step of providing the reflective anode 51 attached to an upper surface of the electrical insulating layer 3 at a second display region 5 and connected to a gate drain electrode of a second thin film transistor device 22. At Step Block S405: manufacturing a transparent anode includes the steps of providing a first transparent anode 41 attached to the upper surface of the electrical insulating layer 3 at a first display region 4 and connected to a gate drain electrode of a first thin film transistor device 21, and providing a second transparent anode 52 covering an upper surface and an outer sidewall of the reflective anode 51 at the second display region 5. At Step Block S406: manufacturing a pixel defining layer includes the steps of providing the pixel defining layer 6 on upper surfaces of the electrical insulating layer 3, the reflective anode 51, the first transparent anode 41 and the second transparent anode 52, and forming at least one first through hole 61 and at least one second through hole 62 at the pixel defining layer 6, wherein the at least one first through hole 61 is corresponding to the first transparent anode 41, and the at least one second through hole 62 is corresponding to the reflective anode 51. At Step Block S407: manufacturing an electroluminescence film includes the steps of providing a first electroluminescence film 42 attached the upper surface of the first transparent anode 41 in the at least one first through hole 61, and providing a second electroluminescence film 53 attached an upper surface of the second transparent anode 52 in the at least one second through hole 62. At Step Block S408: manufacturing a transparent cathode includes the step of providing the transparent cathode 54 in the at least one second through hole 62, and the transparent cathode 54 attached to an upper surface of the second electroluminescence film 53 and also attached to an inner side wall of the at least one second through hole 62. The transparent cathode 54 in the second display region 5 includes a transparent extending part attached to an upper side surface of the pixel defining layer 6, and extending to the inner sidewall of the at least one second through hole 62, and surrounding the at least one second through hole 62. At Step Block S409; manufacturing a reflective cathode includes the step of providing a first reflective cathode 43 in the at least one first through hole 61, and providing a second reflective cathode 55 attached to an upper side surface of the transparent extending part, wherein the first reflective cathode 43 is attached to an upper surface of the first electroluminescence film 42 and also attached to an inner sidewall of the at least one first through hole 61.

In this embodiment, the design that the transparent anode covers the reflective anode solves the technical problem of different order requirements for the electroluminescence films of the two groups of electrodes in the prior art. The design simplifies the original evaporation deposition process with two fine masks to a new process with only one open mask. It simplifies the process and improves process efficiency. In this embodiment, the second reflective cathode is attached to a transparent cathode. The second reflective cathode 55 is used as the auxiliary electrode of the transparent cathode 54. Under the premise that the thickness is kept small, the cathode resistance can be effectively reduced. The technical problem of excessive cathode resistance of the top emission structure is solved. It balances two factors of resistance and transparency, expands the selection range of materials for the transparent cathode, and helps to reduce production costs.

Fourth Embodiment

Figure 10:
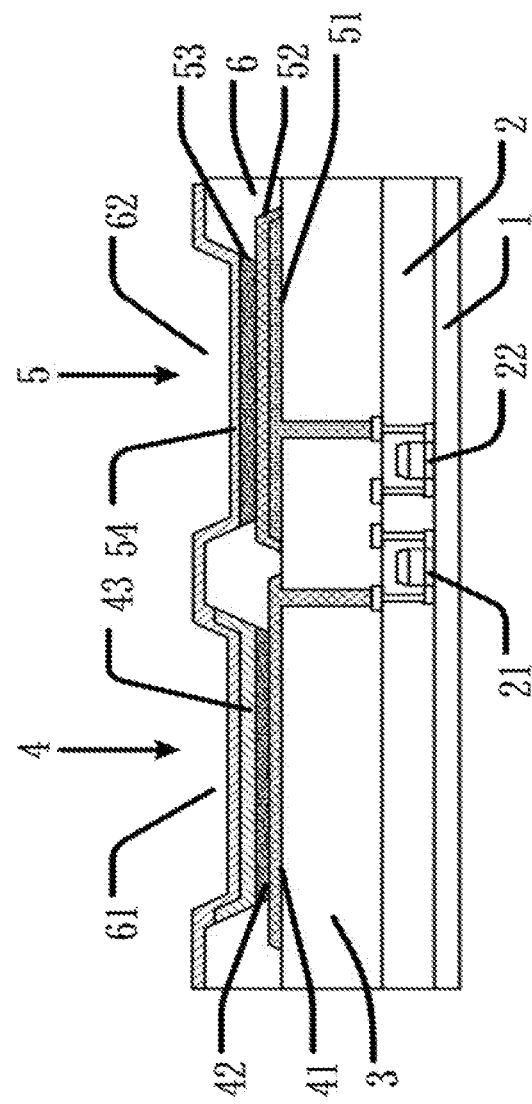
FIG. 10 is a schematic cross section view of a double-sided display device according to the fourth embodiment of the disclosure.

Referring to FIG. 10, one embodiment of the disclosure provides a double-sided display device similar to the first embodiment. The difference is that the double-sided display device disclosed here further includes a transparent cathode 54 covers the first reflective cathode 43, the second electroluminescence film 53, and an upper side surface of the pixel defining layer 6. This makes the first display region 4 and the second display region 5 to have the same low electrical potential.

Figure 11:
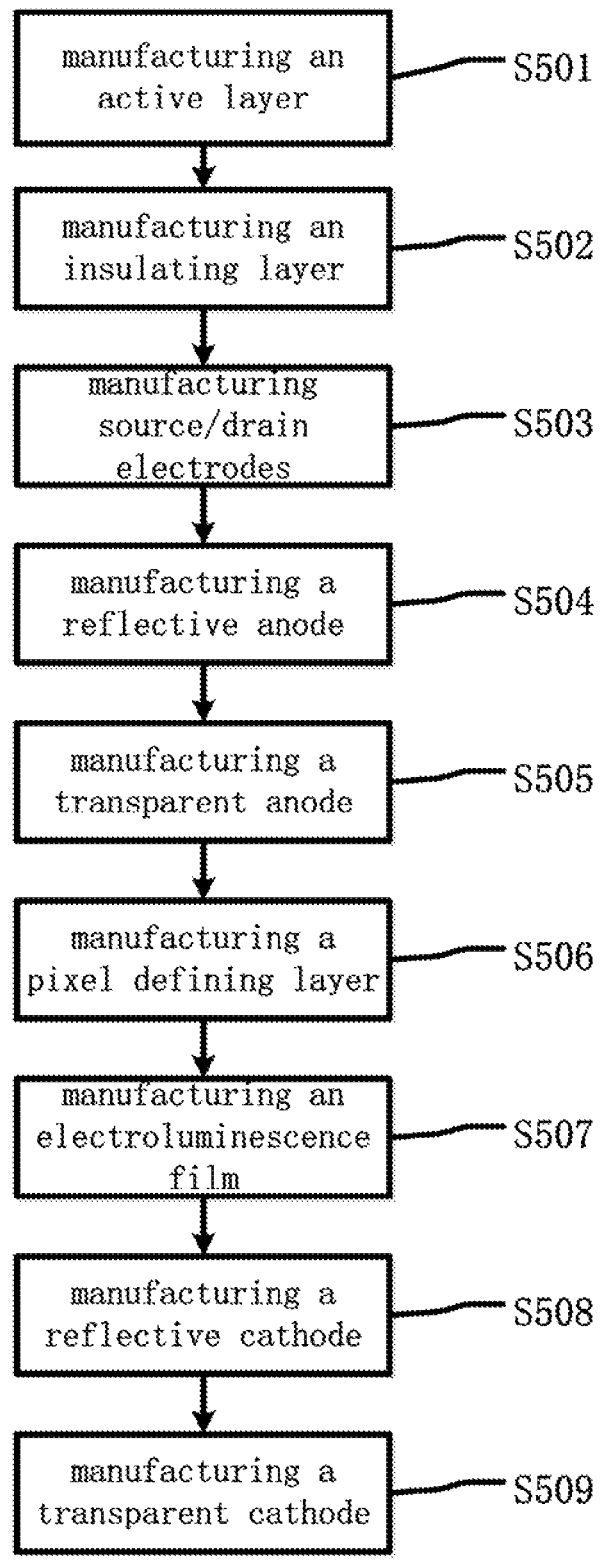
FIG. 11 is a schematic flowchart of a method of manufacturing a double-sided display device according to the fourth embodiment of the disclosure.

Referring to FIG. 11 an embodiment of the disclosure provides a method of manufacturing a double-sided display device. The method includes the steps from S501 to S509

At Step Block S501: manufacturing an active layer includes the step of providing the active layer 2 on a substrate 1 and providing at least one thin film transistor device in the active layer 2. At Step Block S502: manufacturing an electrical insulating layer includes the steps of providing the electrical insulating layer 3 on the active layer 2. At Step Block S503: manufacturing source/drain electrodes includes the steps of etching and forming an electrical conductor on a portion of an upper surface of the active layer 2 to form patterned source/drain electrodes. At Step Block S504: manufacturing a reflective anode includes the step of providing the reflective anode 51 attached to an upper surface of the electrical insulating layer 3 at a second display region 5 and connected to a drain electrode of a second thin film transistor device 22. At Step Block S505: manufacturing a transparent anode includes the steps of providing a first transparent anode 41 attached to the upper surface of the electrical insulating layer 3 at a first display region 4 and connected to a drain electrode of a first thin film transistor device 21, and providing a second transparent anode 52 covering an upper surface and an outer sidewall of the reflective anode 51 at the second display region 5. At Step Block S506: manufacturing a pixel defining layer includes the steps of providing the pixel defining layer 6 on upper surfaces of the electrical insulating layer 3, the reflective anode 51, the first transparent anode 41 and the second transparent anode 52, and forming at least one first through hole 61 and at least one second through hole 62 at the pixel defining layer 6, wherein the at least one first through hole 61 is corresponding to the first transparent anode 41, and the at least one second through hole 62 is corresponding to the reflective anode 51. At Step Block S507: manufacturing an electroluminescence film includes the steps of providing a first electroluminescence film 42 attached the upper surface of the first transparent anode 41 in the at least one first through hole 61, and providing a second electroluminescence film 53 attached an upper surface of the second transparent anode 52 in the at least one second through hole 62. At Step Block S508: manufacturing a reflective cathode includes the step of providing a first reflective cathode 43 in the at least one first through hole 61, and the first reflective cathode 43 attached to an upper surface of the first electroluminescence film 42 and also attached to an inner sidewall of the at least one first through hole 61. At Step Block S509: manufacturing a transparent cathode includes the step of providing the transparent cathode 54 in the at least one second through hole 62, and the transparent cathode 54 attached to an upper surface of the second electroluminescence film 53 and also attached to an inner side wall of the at least one second through hole 62. The transparent cathode 54 covers the first reflective cathode 43, the second electroluminescence film 53, and an upper side surface of the pixel defining, layer 6. This makes the first display region 4 and the second display region 5 to have the same low electrical potential.

In this embodiment, the design that the transparent anode covers the reflective anode solves the technical problem of different order requirements for the electroluminescence films of the two groups of electrodes in the prior art. The design simplifies the original evaporation deposition process with two fine masks to a new process with only one open mask. It simplifies the process and improves process efficiency. In this embodiment, the transparent cathode is covering the reflective cathode. Under the premise that the thickness is kept small, the cathode resistance can be effectively reduced. The technical problem of excessive cathode resistance of the top emission structure is solved. It balances two factors of resistance and transparency, expands the selection range of materials for the transparent cathode, and helps to reduce production costs.

The illumination mode of the double-sided display device provided by the disclosure can use RGB three pixels or white OLED, that is, all sub-pixels are white light structures, and then RGB sub-pixels are formed by color filter, and the present invention is not limited to the way of lighting.

The present invention has been described by the above embodiments, but the embodiments are merely examples for implementing the present invention. It must be noted that the embodiments do not limit the scope of the invention. In contrast, modifications and equivalent arrangements are intended to be included within the scope of the invention.

What is claimed is:

1. A double-sided display device, comprising:
a substrate;
an active layer disposed on a side surface of the substrate;
an electrical insulating layer disposed on a side surface of the active layer opposite to another side surface of the active layer facing the substrate;
a pixel defining layer disposed on a side surface of the electrical insulating layer opposite to another side surface of the electrical insulating layer facing the active layer, the pixel defining layer comprising at least one first through hole and at least one second through hole; and
a first display region and a second display region disposed on the side surface of the electrical insulating layer opposite to another side surface of the electrical insulating layer facing the substrate, wherein the first display region comprises:
a first transparent anode attached to the side surface of the electrical insulating layer opposite to another side surface of the electrical insulating layer facing the active layer, the first transparent anode disposed corresponding to the at least one first through hole;
a first electroluminescence film disposed in the at least one first through hole, and attached to a side surface of the first transparent anode opposite to another side surface of the first transparent anode facing the electrical insulating layer; and
a first reflective cathode disposed in the at least one first through hole, attached to a side surface of the first electroluminescence film opposite to another side surface of the first electroluminescence film facing the first transparent anode, and also attached to an inner sidewall of the at least one first through hole; and
the second display region comprises:
a reflective anode attached to the side surface of the electrical insulating layer opposite to another side surface of the electrical insulating layer facing the active layer, separated from the first transparent anode, and disposed corresponding to the at least one second through hole;
a second transparent anode covering a side surface of the reflective anode opposite to another side surface of the reflective anode facing the active layer, and covering an outer sidewall of the reflective anode;
a second electroluminescence film disposed in the at least one second through hole, and attached to a side surface of the second transparent anode opposite to another side surface of the second transparent anode facing the reflective anode; and
a transparent cathode disposed in the at least one second through hole, attached to a side surface of the second electroluminescence film opposite to another side surface of the second electroluminescence film facing the second transparent anode, and also attached to an inner sidewall of the at least one second through hole, wherein the transparent cathode covers the first reflective cathode, the second electroluminescence film, and a side surface of the pixel defining layer opposite to another side surface of the pixel defining layer facing the substrate.

2. The double-sided display device according to claim 1, wherein the transparent cathode comprises a transparent extending part attached to a side surface of the pixel defining layer opposite to another side surface of the pixel defining layer facing the substrate, extending to the inner sidewall of the at least one second through hole, and surrounding the at least one second through hole, wherein the double-sided display device further comprises a second reflective cathode attached to a side surface of the transparent extending part opposite to another side surface of the transparent extending part facing the substrate.

3. The double-sided display device according to claim 1, further comprising:
a second reflective cathode attached to a side surface of the pixel defining layer opposite to another side surface of the pixel defining layer facing the substrate and surrounding the at least one second through hole, wherein the transparent cathode comprises a transparent extending part attached to a side surface of the second reflective cathode opposite to another side surface of the second reflective cathode facing the substrate and extending to the inner sidewall of the at least one second through hole.

4. The double-sided display device according to claim 1, further comprising a first thin film transistor device and a second thin film transistor device, wherein the first transparent anode connects to a drain electrode of the first thin film transistor device, and the reflective anode connects to a-drain electrode of the second thin film transistor device.

5. A method of manufacturing a double-sided display device, comprising the steps of:
step S1: manufacturing an active layer, comprising the step of providing the active layer on a substrate;
step S2: manufacturing an electrical insulating layer, comprising the steps of providing the electrical insulating layer on the active layer;
step S3: manufacturing source/drain electrodes, comprising the steps of etching and forming an electrical conductor on a portion of an upper surface of the active layer to form patterned source/drain electrodes;
step S4: manufacturing a reflective anode, comprising the step of providing the reflective anode attached to an upper surface of the electrical insulating layer at a second display region;
step S5: manufacturing a transparent anode, comprising the steps of providing a first transparent anode attached to the upper surface of the electrical insulating layer at a first display region, and providing a second transparent anode covering an upper surface and an outer sidewall of the reflective anode at the second display region;
step S6: manufacturing a pixel defining layer, comprising the steps of providing the pixel defining layer on upper surfaces of the electrical insulating layer, the reflective anode, the first transparent anode and the second transparent anode, and forming at least one first through hole and at least one second through hole at the pixel defining layer, wherein the at least one first through hole is corresponding to the first transparent anode, and the at least one second through hole is corresponding to the reflective anode;
step S7: manufacturing an electroluminescence film, comprising the steps of providing a first electroluminescence film attached the upper surface of the first transparent anode in the at least one first through hole, and providing a second electroluminescence film attached an upper surface of the second transparent anode in the at least one second through hole;

step S8: manufacturing a reflective cathode, comprising the step of providing a first reflective cathode in the at least one first through hole, and the first reflective cathode attached to an upper surface of the first electroluminescence film and also attached to an inner sidewall of the at least one first through hole;

step S9: manufacturing a transparent cathode, comprising the step of providing the transparent cathode in the at least one second through hole, and the transparent cathode attached to an upper surface of the second electroluminescence film and also attached to an inner side wall of the at least one second through hole.

6. The method of manufacturing a double-sided display device according to claim 5, wherein the step of manufacturing a reflective cathode further comprises the step of providing a second reflective cathode attached to an upper surface of the pixel defining layer and surrounding the at least one second through hole, and the transparent cathode in the step of manufacturing a transparent cathode further comprises a transparent extending part attached to an upper surface of the second reflective cathode and extending to the inner sidewall of the at least one second through hole.

7. The method of manufacturing a double-sided display device according to claim 5, wherein the transparent cathode in the step of manufacturing a transparent cathode covers upper surfaces of the first reflective cathode, the second electroluminescence film and the pixel defining layer.

8. The method of manufacturing a double-sided display device according to claim 5, performing the step of manufacturing a transparent cathode after the step of manufacturing an electroluminescence film before the step of manufacturing a reflective cathode.

9. The method of manufacturing a double-sided display device according to claim 8, wherein the transparent cathode in the step of manufacturing a transparent cathode further comprises a transparent extending part attached to an upper surface of the pixel defining layer, extending to the inner sidewall of the at least one second through hole, and surrounding the at least one second through hole, and provides a second reflective cathode attached to an upper surface of the transparent extending part in the step of manufacturing a reflective cathode.

10. A double-sided display device, comprising:
a substrate;
an active layer disposed on a side surface of the substrate;
an electrical insulating layer disposed on a side surface of the active layer opposite to another side surface of the active layer facing the substrate;
a pixel defining layer disposed on a side surface of the electrical insulating layer opposite to another side surface of the electrical insulating layer facing the active layer, the pixel defining layer comprising at least one first through hole and at least one second through hole; and
a first display region and a second display region disposed on the side surface of the electrical insulating layer opposite to another side surface of the electrical insulating layer facing the substrate, wherein the first display region comprises:
a first transparent anode attached to the side surface of the electrical insulating layer opposite to another side surface of the electrical insulating layer facing the active layer, the first transparent anode disposed corresponding to the at least one first through hole;
a first electroluminescence film disposed in the at least one first through hole, and attached to a side surface of the first transparent anode opposite to another side surface of the first transparent anode facing the electrical insulating layer; and
a first reflective cathode disposed in the at least one first through hole, attached to a side surface of the first electroluminescence film opposite to another side surface of the first electroluminescence film facing the first transparent anode, and also attached to an inner sidewall of the at least one first through hole; and
the second display region comprises:
a reflective anode attached to the side surface of the electrical insulating layer opposite to another side surface of the electrical insulating layer facing the active layer, separated from the first transparent anode, and disposed corresponding to the at least one second through hole;
a second transparent anode covering a side surface of the reflective anode opposite to another side surface of the reflective anode facing the active layer, and covering an outer sidewall of the reflective anode;
a second electroluminescence film disposed in the at least one second through hole, and attached to a side surface of the second transparent anode opposite to another side surface of the second transparent anode facing the reflective anode;
a transparent cathode disposed in the at least one second through hole, attached to a side surface of the second electroluminescence film opposite to another side surface of the second electroluminescence film facing the second transparent anode, and also attached to an inner sidewall of the at least one second through hole;
a second reflective cathode attached to a side surface of the pixel defining layer opposite to another side surface of the pixel defining layer facing the substrate and surrounding the at least one second through hole, wherein the transparent cathode comprises a transparent extending part attached to a side surface of the second reflective cathode opposite to another side surface of the second reflective cathode facing the substrate and extending to the inner sidewall of the at least one second through hole.

11. The double-sided display device according to claim 10, wherein the transparent cathode comprises a transparent extending part attached to a side surface of the pixel defining layer opposite to another side surface of the pixel defining layer facing the substrate, extending to the inner sidewall of the at least one second through hole, and surrounding the at least one second through hole, wherein the double-sided display device further comprises a second reflective cathode attached to a side surface of the transparent extending part opposite to another side surface of the transparent extending part facing the substrate.

12. The double-sided display device according to claim 10, wherein the transparent cathode covers the first reflective cathode, the second electroluminescence film, and a side surface of the pixel defining layer opposite to another side surface of the pixel defining layer facing the substrate.

13. The double-sided display device according to claim 10, further comprising a first thin film transistor device and a second thin film transistor device, wherein the first transparent anode connects to a drain electrode of the first thin film transistor device, and the reflective anode connects to a-drain electrode of the second thin film transistor device.

\* \* \* \* \*